US006448124B1

(12) United States Patent
Coolbaugh et al.

(10) Patent No.: US 6,448,124 B1
(45) Date of Patent: Sep. 10, 2002

(54) METHOD FOR EPITAXIAL BIPOLAR BICMOS

(75) Inventors: Douglas D. Coolbaugh, Essex Junction, VT (US); James S. Dunn, Jericho, VT (US); Peter J. Geiss, Underhill, VT (US); Peter B. Gray, Essex Junction, VT (US); David L. Harame, Essex Junction, VT (US); Kathryn T. Schonenberg, New Fairfield, CT (US); Stephen A. St. Onge, Colchester, VT (US); Seshadri Subbanna, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/439,067

(22) Filed: Nov. 12, 1999

(51) Int. Cl.$^7$ .......................................... H01L 21/8238
(52) U.S. Cl. ...................................... 438/202; 438/234
(58) Field of Search ................................ 438/202, 234, 438/203, 204, 365, 361, 360, 350

(56) References Cited

U.S. PATENT DOCUMENTS

| 4,922,318 A | 5/1990 | Thomas et al. |
| 5,023,193 A | 6/1991 | Manoliu et al. |
| 5,045,484 A | 9/1991 | Yamada et al. |
| 5,045,493 A | 9/1991 | Kameyama et al. |
| 5,340,762 A | 8/1994 | Vora |
| 5,342,794 A | 8/1994 | Wei |
| 5,356,821 A | 10/1994 | Naruse et al. |
| 5,374,569 A | 12/1994 | Yilmaz et al. |
| 5,439,833 A | 8/1995 | Hebert et al. |
| 5,557,131 A | 9/1996 | Lee ............................ 257/370 |
| 5,583,059 A | 12/1996 | Burghartz |
| 5,607,866 A | 3/1997 | Sato et al. |
| 5,665,615 A | 9/1997 | Anmo ......................... 438/202 |
| 5,665,616 A | 9/1997 | Kimura et al. ............... 438/234 |
| 5,766,990 A | 6/1998 | El-Diwany ................... 438/202 |
| 5,843,814 A | 12/1998 | Manning ..................... 438/202 |

OTHER PUBLICATIONS

Higasgitani et al., "Submicron CBiCMOS Technology with New Well and Buried Layer Formed by Multiple Energy Ion Implantation", IEEE Custom integrated Circuits Conference, 1991, pp. 18.4.1–18.4.4.*

* cited by examiner

*Primary Examiner*—Tuan H. Nguyen
(74) *Attorney, Agent, or Firm*—Scully, Scott, Murphy & Presser; William D. Sabo

(57) ABSTRACT

A method of forming a BiCMOS integrated circuit is provided which comprises the steps of: (a) forming a first portion of a bipolar device in first regions of a substrate; (b) forming a first protective layer over said first regions to protect said first portion of said bipolar devices; (c) forming field effect transistor devices in second regions of said substrate; (d) forming a second protective layer over said second regions of said substrate to protect said field effect transistor devices; (e) removing said first protective layer; (f) forming a second portion of said bipolar devices in said first regions of said substrate; and (g) removing said second protective layer.

25 Claims, 5 Drawing Sheets

METHOD FOR EPITAXIAL BIPOLAR BICMOS

FIELD OF THE INVENTION

The present invention relates to a method of fabricating integrated circuits and, in particular to a method of forming field effect transistors (FETs) and bipolar devices on the same substrate. More specifically, the present invention provides an integration scheme that is capable of fabricating a base-after gate BiCMOS (i.e., bipolar device and complementary metal oxide semiconductor (CMOS) device) integrated circuit which solves the problems typically associated with prior art integration schemes.

BACKGROUND OF THE INVENTION

In the field of semiconductor device manufacturing, it is well known to fabricate BiCMOS integrated circuits using a so-called base-during gate process. Base-during gate processes are described, for example, in D. L. Harame, et al. "Si/SiGe Epitaxial—Base Transistors—Part I: Materials Physics and Circuits", IEEE Trans. Elect. Devices, pp. 469–482, March 1995; D. L. Harame, et al., "Si/SiGe Epitaxial—Base Transistors—Part II: Process Integration and Analog Applications", IEEE Trans. Elect. Devices, pp. 469–482, March 1995; and D. Ahlgren, et al., "A SiGe HBT BiCMOS Technology for Mixed Signal RF Applications", Proc. of the 1997 BCTM, pp 95–197, 1997. In such base-during gate processes, the gate polysilicon is formed at the same time as the base epitaxial silicon is grown.

An alternative method of fabricating BiCMOS integrated circuits is to employ a base-after gate process. In this process, the gate polysilicon is formed before the base epitixial silicon is grown. Such a process is described, for example, in U.S. Pat. No. 5,665,615 to Anmo and 5,665,616 to Kimura, et al.

Several problems are evident in using such prior art processes. A first problem is controlling the base outdiffusion during CMOS source/drain (S/D) and lightly doped drain (LDD) anneals. A second problem is how to provide a high quality epitaxial surface for base growth; and a third problem is how to protect the CMOS device during bipolar device formation. When a base-after gate integration scheme is employed, the following two additional manufacturing requirements must be taken into consideration: First, FET spacer structures must not be produced on the bipolar devices; and secondly, bipolar films must not be left on the FET devices after fabricating the same.

In view of the aforementioned drawbacks with prior art integration schemes for BiCMOS fabrication, there is a continued need for developing a new and improved base-after gate integration process wherein all of the above-mentioned problems and requirements have been met.

SUMMARY OF THE INVENTION

One object of the present invention is to provide a method of fabricating a BiCMOS integrated circuit in which the FETs and bipolar devices are fabricated on the same substrate.

Another object of the present invention is to provide a method of fabricating a BiCMOS integrated circuit using an integration scheme in which no thermal limitation is put on the CMOS device during bipolar device formation.

A still further object of the present invention is to provide a method in which a high quality surface for epitaxial base growth is provided.

A yet further object of the present invention is to provide a method of fabricating a BiCMOS device in which the CMOS devices are protected during bipolar device formation and vice versa.

An additional object of the present invention is to provide a method of fabricating a BiCMOS device in which bipolar films are not left on the FET devices. These and other objects and advantages are met by forming portions of bipolar devices on a substrate, protecting the portions with a protective layer while forming FET devices, and protecting the FET devices while forming other portions of the bipolar devices. Specifically, the method of the present invention comprises the steps of:

(a) forming a first portion of a bipolar device in first regions of a substrate;

(b) forming a first protective layer over said first regions to protect said first portion of said bipolar device;

(c) forming a field effect transistor device in second regions of said substrate;

(d) forming a second protective layer over said second regions of said substrate to protect said field effect transistor device;

(e) removing said first protective layer;

(f) forming a second portion of said bipolar device in said first regions of said substrate; and (g) removing said second protective layer.

In one embodiment of the present invention, a portion of the second protective layer remains in;the structure covering a portion of said bipolar device. In other embodiments of the present invention, a portion of the first protective layer remains over the FET device or portions of the first and second protective layers remain in the structure after fabrication.

DETAILED DESCRIPTION

Figure 1:
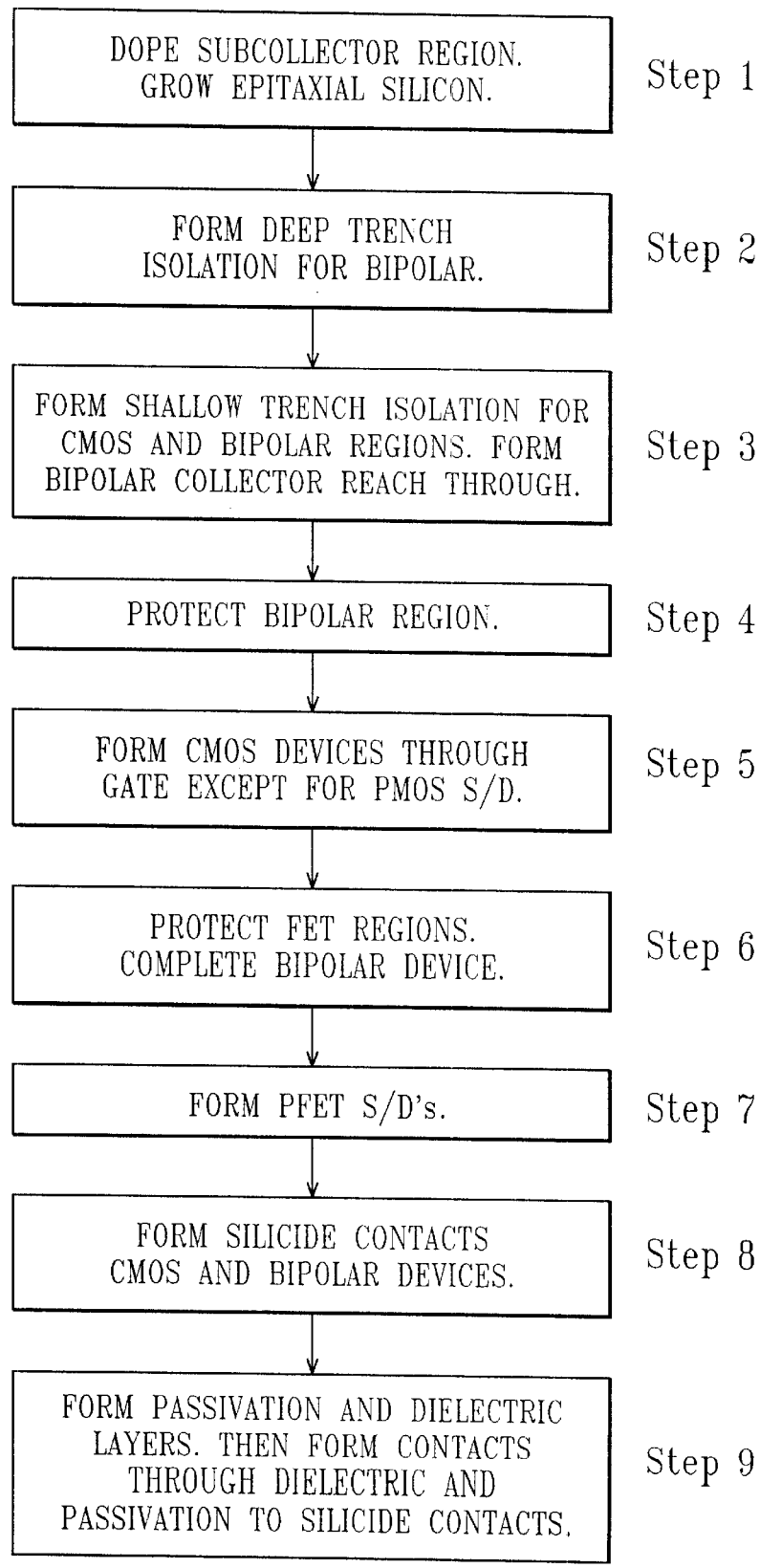
FIG. 1 is a flow chart illustrating the integration scheme, including the various processing steps that are employed in the present invention.

The present invention which provides a method of fabricating a BiCMOS integrated circuit using a base-after gate processing scheme will now be described in more detail by referring to the drawings that accompany the present application. It should be noted that in the accompanying drawings like and corresponding elements are referred to by like reference numerals.

Reference is first made to FIG. 1 which is a flow chart illustrating the basic processing steps of the integration scheme of the present invention. The various steps shown in the flow chart will be described in more detail by referring to FIGS. 2A–2M and the discussion to follow hereinbelow.

Insofar as FIGS. 2A–2M are concerned, those figures are cross-sections showing the various processing steps that are employed in the present invention in fabricating a BiCMOS structure containing bipolar devices and NMOS devices. Although an NMOS device is shown and illustrated, the present invention can be used in fabricating PMOS devices. In embodiments wherein a PMOS device is formed, the same sequence of processing steps as described hereinbelow is employed except for the source/drain regions which are formed after completion of the bipolar devices.

Figure 2A:
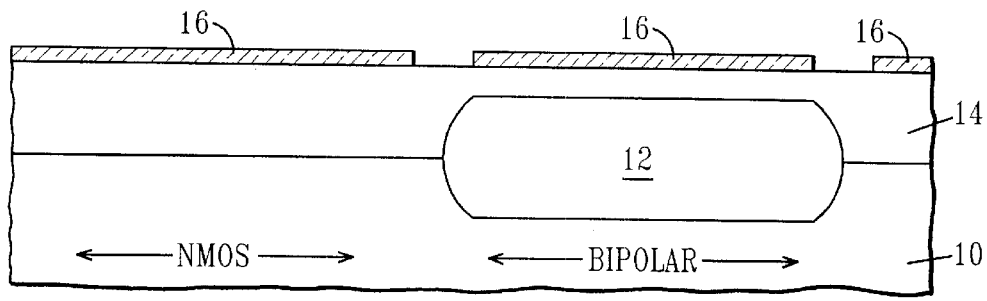
FIGS. 2A–2M are cross-sectional views showing the fabrication of bipolar and NMOS devices on the same substrate using the method of the present invention.

As stated above, the first step of the present invention involves forming a first portion of a bipolar device in first regions of a substrate. This step of the present invention is shown in FIG. 2A (which corresponds to process step 1 of FIG. 1). Specifically, the structure shown in FIG. 2A comprises a P-substrate 10, a buried N+region 12, an N-epitaxial layer 14 and a patterned masking layer 16. The N+region becomes the subcollector region of the bipolar device.

The structure shown in FIG. 2A is fabricated using conventional bipolar processing steps that are well known to those skilled in the art. Moreover, conventional materials are used in fabricating the same. For example, the substrate is composed of any semiconducting material including, but not limited to: Si, Ge, SiGe, GaAs, InAs, InP and all other III/V semiconductor compounds. Layered substrates comprising the same or different semiconducting material, e.g. Si/SiGe, are also contemplated herein. Of these materials, it is preferred that the substrate be composed of Si. Although a p-doped substrate is shown, n-doped substrates are also contemplated herein.

Specifically, the structure shown in FIG. 2A is fabricated as follows: An oxide film, e.g. $SiO_2$, (not shown in the drawings) is formed on the surface of substrate 10 using a conventional deposition process such as chemical vapor deposition (CVD), plasma-enhanced CVD or sputtering, or alternatively the oxide layer is grown thermally. The buried N+region is formed in the substrate by a conventional ion implantation step. The buried region is activated by employing a conventional anneal (rapid thermal anneal (RTA) or oven anneal) and then the N-epitaxial layer is formed utilizing a conventional epitixial growing process. A layer of masking material, e.g. $Si_3N_4$, is formed on the surface of the N-epitaxial layer utilizing a conventional deposition process such as CVD and then it is patterned by conventional lithography and etching (reactive ion etching (RIE)).

The above processing steps lead to the formation of the structure shown in FIG. 2A. It is noted that the drawings of the present application include labels which indicate the region wherein the NMOS device is to be fabricated and the region wherein the bipolar device is to be fabricated. Although the drawings show only one NMOS device region and one bipolar device region, any number of NMOS device regions and bipolar device regions may be formed utilizing the method of the present invention. Also, it is possible to form BiCMOS structures containing NMOS, PMOS and bipolar devices or BiCMOS structures including PMOS and bipolar devices.

The patterned masking layer is employed in the present invention to etch deep trench isolation regions 18 for the bipolar devices. The deep trench isolation is shown complete in FIG. 2B (corresponding to step 2 of FIG. 1). Specifically, the deep trench isolation region is formed by etching a trench in the structure utilizing a conventional dry etching process such as RIE or plasma etching. The deep trench is lined with a conventional deep trench liner material 20, e.g. an oxide, and then CVD or another like deposition process is used to fill the deep trench with polysilicon or another like dielectric material 22. A conventional planarization process such as chemical-mechanical polishing (CMP) is used to provide the planar structure shown in FIG. 2B.

Figure 2B:
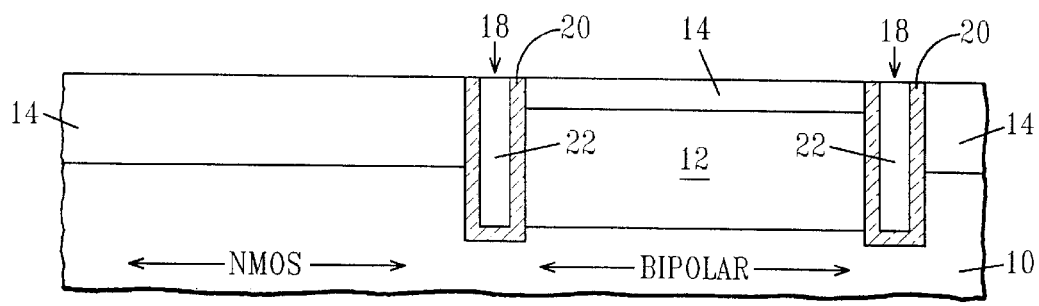
Figure 2C:
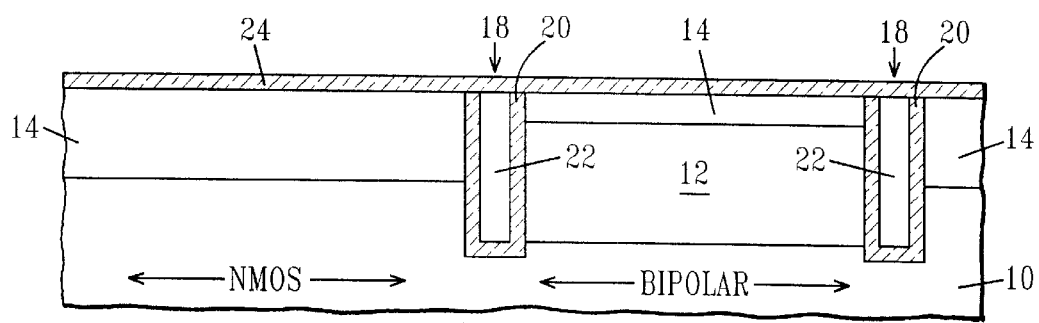
Figure 2D:
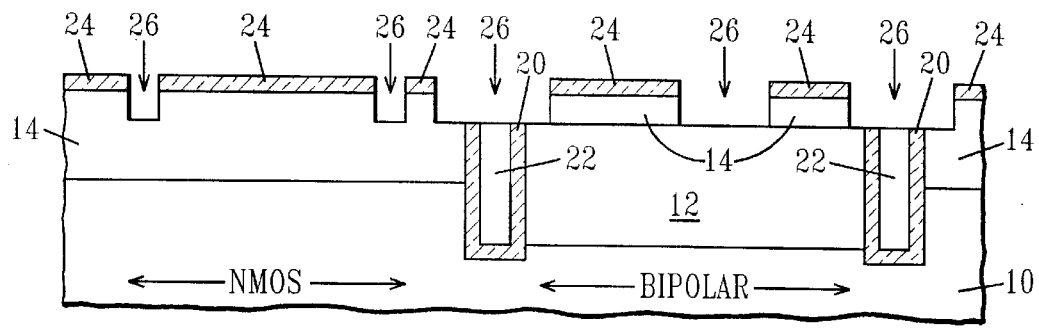

Next as indicated in step 3 of FIG. 1, shallow trench isolation (STI) for the CMOS devices and the bipolar devices, as well as the collector reach-through for the bipolar devices are formed in the structure shown in FIG. 2B. These processing steps are illustrated in FIGS. 2C–2F of the present application. Specifically, as is shown in FIG. 2C, a masking layer 24 is formed on the surface of the structure utilizing conventional deposition processes such as CVD. This masking layer may be composed of the same or different material as the previous masking layer. Masking layer 24 is patterned and shallow trenches 26 are then etched through exposed portions of masking layer 24 providing the structure shown in FIG. 2D.

Figure 2E:
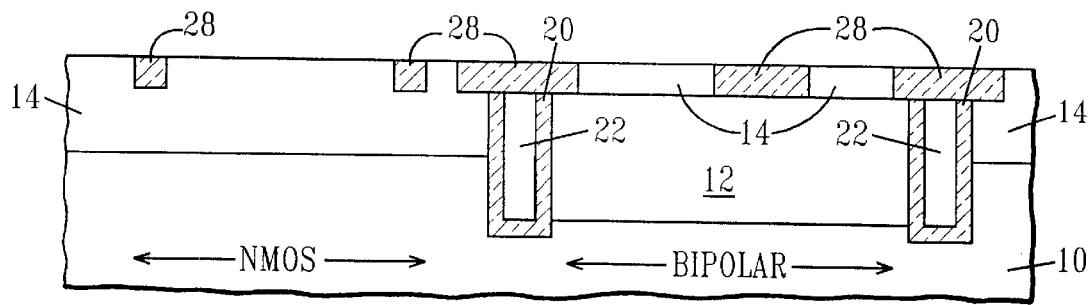

The shallow trenches are then subjected to conventional processes well known to those skilled in the art that are capable of providing STI regions 28, See FIG. 2E. This includes STI dielectric fill and planarization. Optionally, the STI procedure may include: forming a liner in the shallow trench prior STI dielectric fill; and densifying the STI dielectric.

Figure 2F:
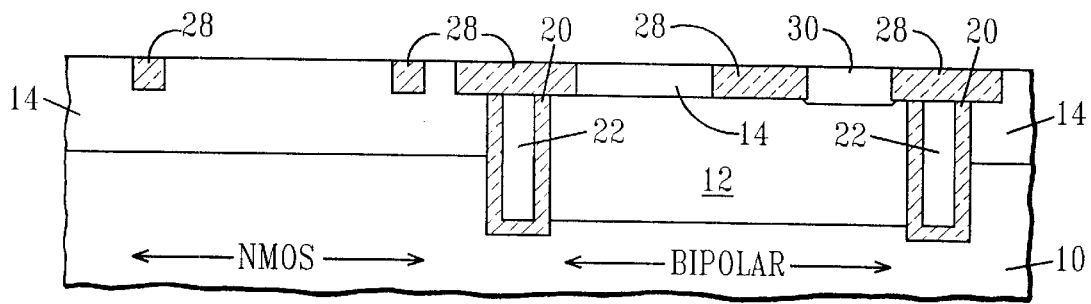

After completion of the STI regions, a reach-through region (or collector) 30 for subcollector 12 is formed in the bipolar device region utilizing conventional procedures that are capable of forming the same. This includes ion implantation and annealing. The structure that is formed after STI and reach-through formation is shown in FIG. 2F.

Figure 2G:
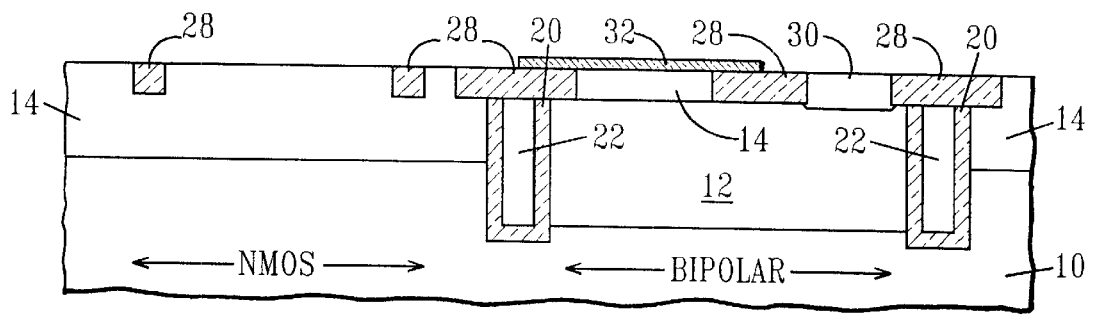

Next, as indicated in FIG. 1, step 4, a first protective layer is formed over a portion of the bipolar device region. Specifically, as shown in FIG. 2G, first protective layer 32 is formed over N-epitaxial layer 14 (and overlapping the deep trench) upon which the bipolar device will be formed. One type of protective layer employed in the present invention for protecting the bipolar device region comprises a $Si_3N_4$ layer. The $Si_3N_4$ layer typically has a thickness of from about 10 to about 1000 Å, with a thickness of from about 500 to about 800 Å being highly preferred. The $Si_3N_4$ layer may be formed by any conventional deposition process, with a low pressure CVD process being highly preferred. It is noted that the present invention contemplates the use of other protective materials besides the $Si_3N_4$ layer mentioned above that are capable of protecting the bipolar device region during CMOS fabrication.

After protecting a portion of the bipolar device region with a protective layer, the FET devices are completely fabricated, with the exception of PFET source/drain regions which occur after completion of the bipolar device regions; See FIG. 1, step 5.

The FET devices are formed utilizing conventional processing steps that are capable of fabricating transistor devices. Included in the conventional transistor processing steps are: N-well for pFET photolithography, N-well implant, pFET thin oxide tailor implant, P-well for nFET photolithography, P-well implant, n-FET thin oxide tailor implant, dual gate oxide photolithography, dual gate oxide regrowth, FET gate photolithography, FET gate etch, thermal oxide spacer formation, nFET extension photolithography, nFET extension implant (lightly doped drains (LDD)), first spacer formation, pFET extension photolithography, PFET extension (LDD), second spacer deposition, second spacer etch, nFET S/D implant photolithography, nFET S/D anneals.

Figure 2H:
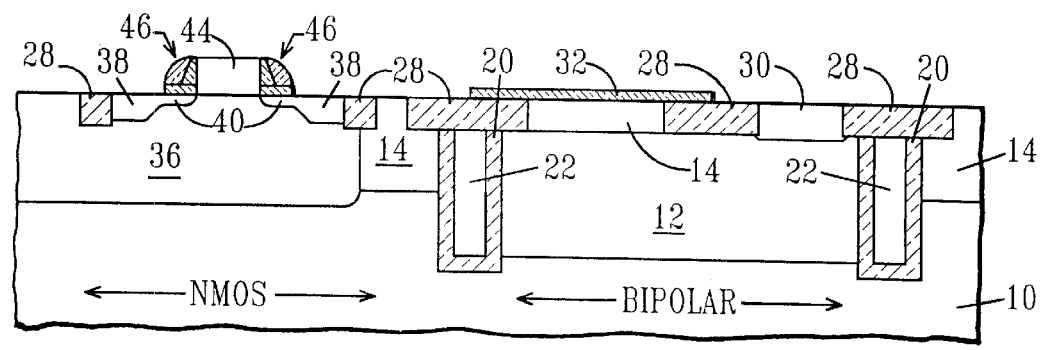
Figure 2I:
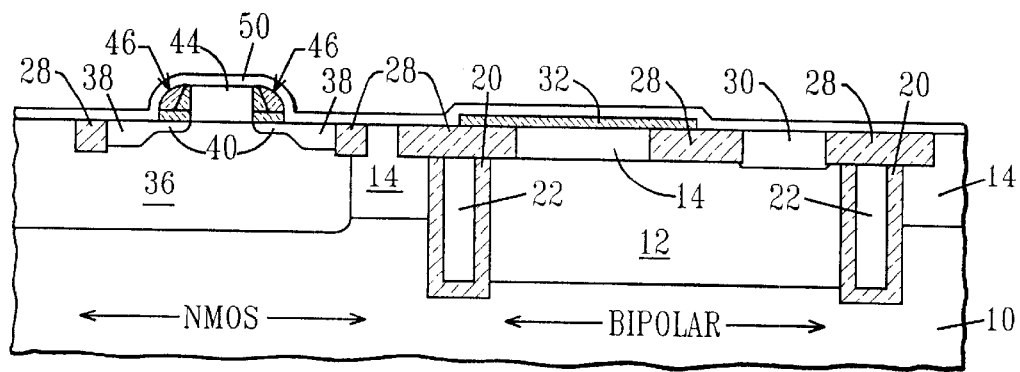

These transistor processing steps form the FET device in the structure shown in FIG. 2H. Specifically, the FET device includes P-well 36, S/D regions 38, S/D extensions 40, gate region (gate and gate oxide) 44, spacers 46. The spacers depicted in the drawings include various layers that are formed on the sidewalls of the gate region as well as a horizontal layer that is formed on the substrate.

next, as described in FIG. 1, step 6, a second protective layer 50 is formed over the structure shown in FIG. 2H providing the structure shown in FIG. 2I. Specifically, the second protective layer is formed over the FET device and the reach-through region of the bipolar device. Second protective layer 50 may be composed of a single layered material or multiple layers of the same or different materials can be used as second protective layer 50, e.g. the second protective layer could be composed of an oxide layer and polysilicon layer. For simplicity, reference numeral 50 is used herein to include a single layer protective layer or a multilayered protective layer.

Any material or materials that are capable of protecting the FET devices during completion of the bipolar devices may be employed in the present invention and any known deposition process may be employed in forming a layer (or multilayers) of the same on the structure. It is preferred in the present invention that the second protective layer be composed of an oxide which is deposited by a plasma-enhanced CVD process. The thickness of the second protective layer(s) may vary, but typically the thickness of the second protective layer(s) is from about 100 to about 500 Å, with a thickness of from about 150 to about 250 Å being highly preferred.

Figure 2J:
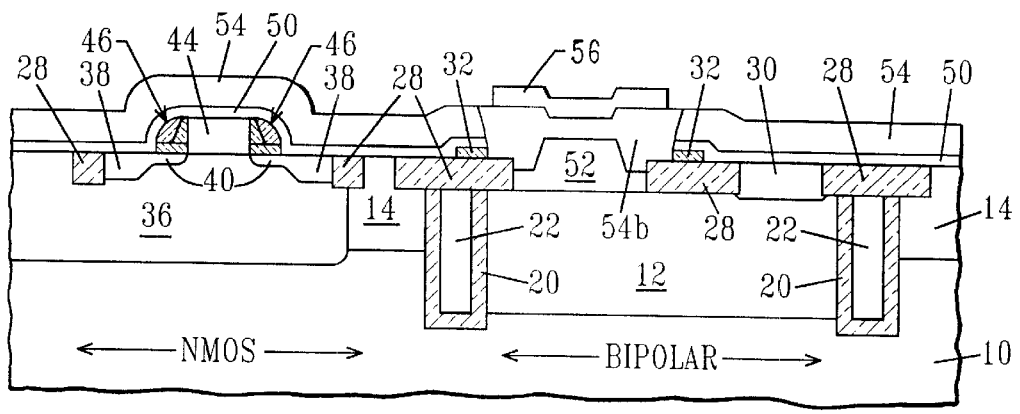
Figure 2K:
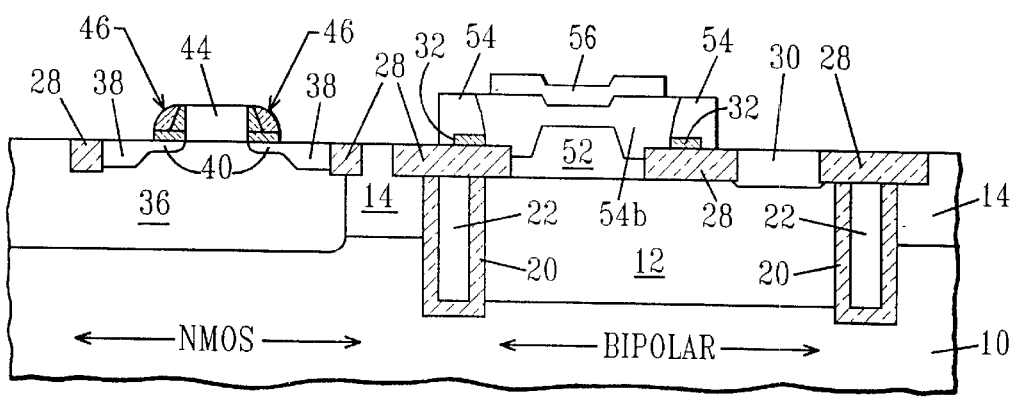

After protecting the FET devices of the structure with the second protective layer, the bipolar devices are then completed, See FIG. 2J, utilizing conventional processing steps that are capable of completing the fabrication of the bipolar devices. These processing steps create additional films that overlay the second protective layer. Specifically, the bipolar devices are completed by growing an epitaxial base and then forming any bipolar emitter device thereon. The bipolar devices contemplated in the present invention can be non-aligned or self-aligned. One preferred process that may be employed in the present invention in forming the bipolar devices includes: etching a bipolar window through second protective layer 50 and first protective layer 32 that overlay a portion of collector region 12, forming an emitter pedestal SiGe in the bipolar window, extrinsic base formation, second collector implant, define emitter polysilicon and extrinsic base polysilicon. It is again emphasized that the above process description represents one technique that can be employed in the present invention in forming the bipolar devices. Other techniques that are well known in the art in forming bipolar devices can also be employed in the present invention.

These processing steps result in the structure shown in FIG. 2J. Specifically, FIG. 2J comprises the structure of FIG. 2I containing N-layer 52, P+polysilicon layer 54 (it is noted that in FIG. 2J reference numeral 54*b* represents the P+polysilicon formed on the bipolar device) and N+polysilicon layer 56, wherein layer 52, 54, 54*b* and 56 form the completed bipolar device. It is noted that during the window etch, substantially all of the first protective layer is removed from the structure. In one embodiment of the present invention, some of the first protective layer remains in the bipolar device region of the structure.

Next, as described in FIG. 1, step 7, portions of bipolar layer 54 and all of the second protective layer are removed from the structure utilizing a conventional etch process which is highly selective in removing those two layers without attacking the underlying structure. If PFETs are previously formed, then the PFET S/D regions are formed following the above etch step by conventional implantation and activation anneal. These processing steps produce the structure shown in FIG. 2K.

Although the drawings show removal of substantially all of the second protective layer from the structure, the present invention also contemplates leaving some of the second protective layer over the collector region of the bipolar device.

Figure 2L:
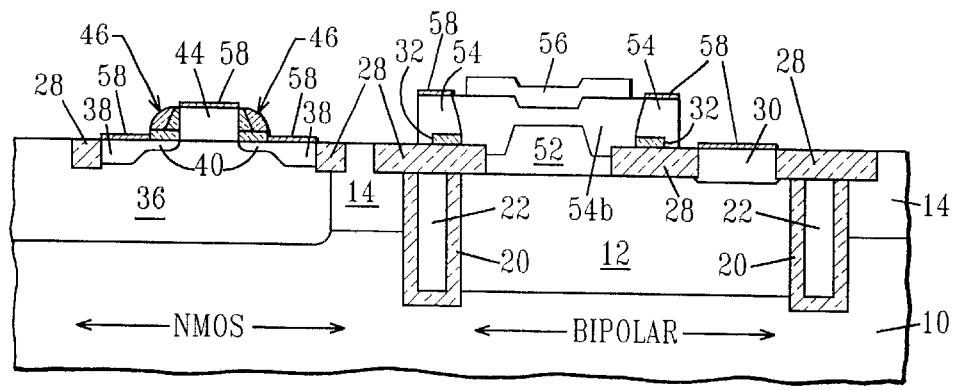

As described in FIG. 1, step 8, metal polysilicon contacts 58 are formed on the S/D implants and gates as well as the bipolar collector and base regions, See FIG. 2L. The contacts are formed utilizing conventional processing steps well known in the art that are capable of forming the contact regions. Included in these contact formation processing steps include: resistor silicide block mask, Ti deposition and Ti anneal.

Figure 2M:
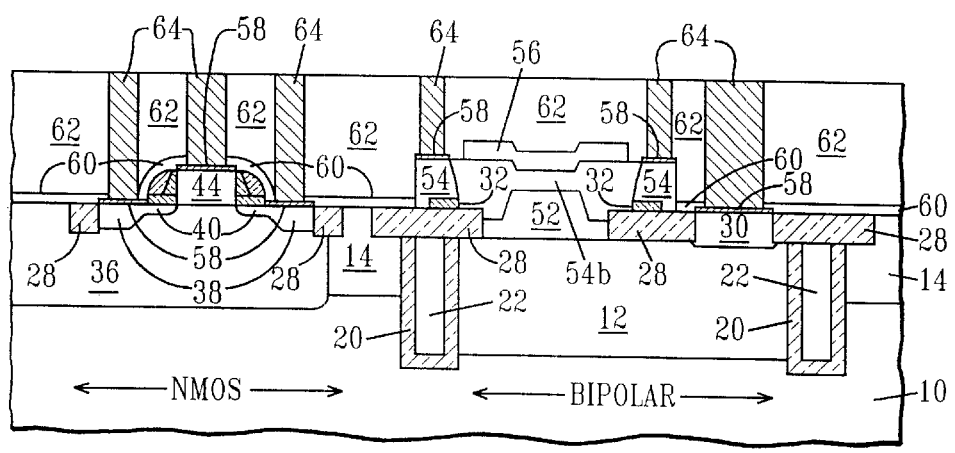

Next, as shown in FIG. 1, step 9, and FIG. 2M, a passivation layer 60 and dielectric layer 62 are formed over the FET and bipolar devices and metal vias or contact studs 64 are formed through those layers to metal polysilicon contacts 58. Conventional deposition processes are used in forming the passivation and dielectric layers and the contact openings are formed by conventional lithography and etching. The contact openings are filled utilizing a conventional deposition process and, if needed, a conventional planarization process is employed.

Any conventional passivation material such as $Si_3N_4$ or a polyimide may be employed in forming layer 60; and any conventional dielectric material such as $SiO_2$ or $Si_3N_4$ may be employed in forming layer 62. Insofar as the contact studs are concerned, any conventional conductive metal such as Ti, W, Cu, Cr and Pt may be employed in the present invention.

While the preferred embodiment illustrated above is described for using a SiGe bipolar device, the present invention is not limited to SiGe device, but includes other epitaxial devices.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim is new, and desire to secure by the Letters Patent is:

1. A method of forming a BiCMOS integrated circuit comprising the steps of:
  (a) forming a first portion of a bipolar device in first regions of a substrate, said first portion does not include an epitaxially grown base;
  (b) forming a first protective layer over said first regions to protect said fist portion of said bipolar device;
  (c) forming a field effect transistor device in second regions of said substrate;
  (d) forming a second protective layer over said second regions of said substrate to protect said field effect transistor device;
  (e) removing said first protective layer;
  (f) forming a second portion of said bipolar device in said first regions of said substrate, wherein said second portion includes said epitaxially grown base which is also formed atop the second protective layer in said second regions; and
  (g) removing said second protective layer and epitaxially grown base over said second protective layer in said second regions exposing said field effect transistor device.

2. The method of claim 1 further comprising forming metal polysilicon contacts on portions of said exposed field effect transistor device and on portions of said bipolar device.

3. The method of claim 2 further comprising forming a passivation layer on said exposed field effect transistor device, said bipolar device and said metal polysilicon contacts.

4. The method of claim 3 further comprising forming a dielectric layer on said passivation layer.

5. The method of claim 4 further comprising forming contact studs through said dielectric layer and said passivation layer to said metal polysilicon contacts.

6. The method of claim 1 wherein step (a) includes providing a subcollector region in said substrate and growing epitaxial silicon on said substrate.

7. The method of claim 1 wherein step (b) includes etching trenches in said substrate, lining said trenches with a liner material, filling said trenches with a dielectric material and planarizing.

8. The method of claim 1 wherein said first protective layer comprises a $Si_3N_4$ layer.

9. The method of claim 8 wherein said $Si_3N_4$ layer is formed by low pressure CVD.

10. The method of claim 8 wherein said $Si_3N_4$ layer has a thickness of from about 10 to about 1000 Å.

11. The method of claim 10 wherein said $Si_3N_4$ layer has a thickness of from about 500 to about 800 Å.

12. The method of claim 1 wherein step (c) includes forming well implants, source/drain regions, source/drain extensions, gate oxide growth and spacer formation.

13. The method of claim 1 wherein said second protective layer is composed of a multilayer comprises a layer of an oxide and a layer of polysilicon.

14. The method of claim 1 wherein said second protective layer is composed of an oxide.

15. The method of claim 14 wherein said layer of oxide is formed by plasma-enhanced CVD.

16. The method of claim 1 wherein said second protective layer has a thickness of from about 100 to about 500 Å.

17. The method of claim 16 wherein said second protective layer has a thickness of from about 150 to about 250 Å.

18. The method of claim 1 wherein said epitaxially grown base is formed in a bipolar window.

19. The method of claim 1 wherein said epitaxially grown base in SiGe.

20. The method of claim 1 wherein step (g) includes a reactive ion etch process.

21. The method of claim 1 wherein a portion of said first protective layer is not removed.

22. The method of claim 1 wherein a portion of said second protective layer is not removed.

23. The method of claim 1 wherein a portion of said first and said second protective layers are not removed.

24. The method of claim 14 wherein a plurality of bipolar devices and field effect transistor devices are formed.

25. The method of claim 1 wherein said field effect transistor device is a pFET or an nFET.

* * * * *